(12) United States Patent
Suh et al.

(10) Patent No.: US 8,182,304 B2
(45) Date of Patent: May 22, 2012

(54) METHOD OF MANUFACTURING AN ORGANIC ELECTROLUMINESCENT DEVICE HAVING ORGANIC LIGHT-EMITTING TRANSISTORS

(75) Inventors: Min-Chul Suh, Yongin (KR); Jae-Bon Koo, Yongin (KR); Hye-Dong Kim, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 42 days.

(21) Appl. No.: 12/841,033

(22) Filed: Jul. 21, 2010

(65) Prior Publication Data

US 2010/0291716 A1 Nov. 18, 2010

Related U.S. Application Data

(62) Division of application No. 11/267,740, filed on Nov. 4, 2005, now Pat. No. 7,800,300.

(30) Foreign Application Priority Data

Nov. 17, 2004 (KR) .................. 10-2004-0094179

(51) Int. Cl.
*H01J 29/10* (2006.01)
*H01L 29/04* (2006.01)

(52) U.S. Cl. ............ 445/24; 313/506; 313/507; 257/40

(58) Field of Classification Search .......... 313/498–512; 438/26–29, 34, 82; 257/40, 72, 98–100, 257/642–643, 759; 315/169.1
See application file for complete search history.

(56) References Cited

U.S. PATENT DOCUMENTS 7,399,989 B2 * 7/2008 Moriya et al. ................ 257/40
(Continued)

FOREIGN PATENT DOCUMENTS

CN 1534800 10/2004
(Continued)

OTHER PUBLICATIONS

C. Roost, et al., "Ambipolar organic field-effect transistor based on an organic heterostructure." Journal of Applied Physics, vol. 95, No. 10, May 14, 2004, pp. 5782-5787.

(Continued)

*Primary Examiner* — Tracie Y Green
(74) *Attorney, Agent, or Firm* — Knobbe, Martens, Olson & Bear, LLP

(57) ABSTRACT

An EL device with low manufacturing costs and improved yield due to simplified structure and use of an organic light emitting transistor and a method of manufacturing the same are disclosed. The EL device includes: a first organic light emitting transistor including a first source electrode; a first drain electrode opposing the first source electrode; a first intermediate layer including at least an emission layer formed between the first source electrode and the first drain electrode; and a first gate electrode which is insulated from the first source electrode, the first drain electrode, and the first intermediate layer and surrounds the first intermediate layer; and a second organic light emitting transistor including a second source electrode; a second drain electrode opposing the second source electrode; a second intermediate layer including at least an emission layer formed between the second source electrode and the second drain electrode; and a second gate electrode which is insulated from the second source electrode, the second drain electrode, and the second intermediate layer, surrounds the second intermediate layer, and is connected to the first drain electrode.

12 Claims, 18 Drawing Sheets

U.S. PATENT DOCUMENTS

| | | | |
|---|---|---|---|
| 2003/0094897 A1 | 5/2003 | Koyama et al. | |
| 2003/0213952 A1 | 11/2003 | Iechi et al. | |
| 2003/0218166 A1* | 11/2003 | Tsutsui | 257/40 |
| 2005/0110005 A1* | 5/2005 | Forrest et al. | 257/40 |

FOREIGN PATENT DOCUMENTS

| | | |
|---|---|---|
| EP | 0212328 | 3/1987 |
| EP | 1367659 | 12/2003 |
| JP | 2003086804 | 3/2003 |
| JP | 2003133057 | 5/2003 |
| JP | 2003282256 | 10/2003 |

OTHER PUBLICATIONS

Japanese Office Action in corresponding Japanese application No. 2006148097 dated Aug. 25, 2009.

Certificate of Patent for Invention in corresponding Chinese Application No. 100512583, issued Jul. 8, 2009.

* cited by examiner

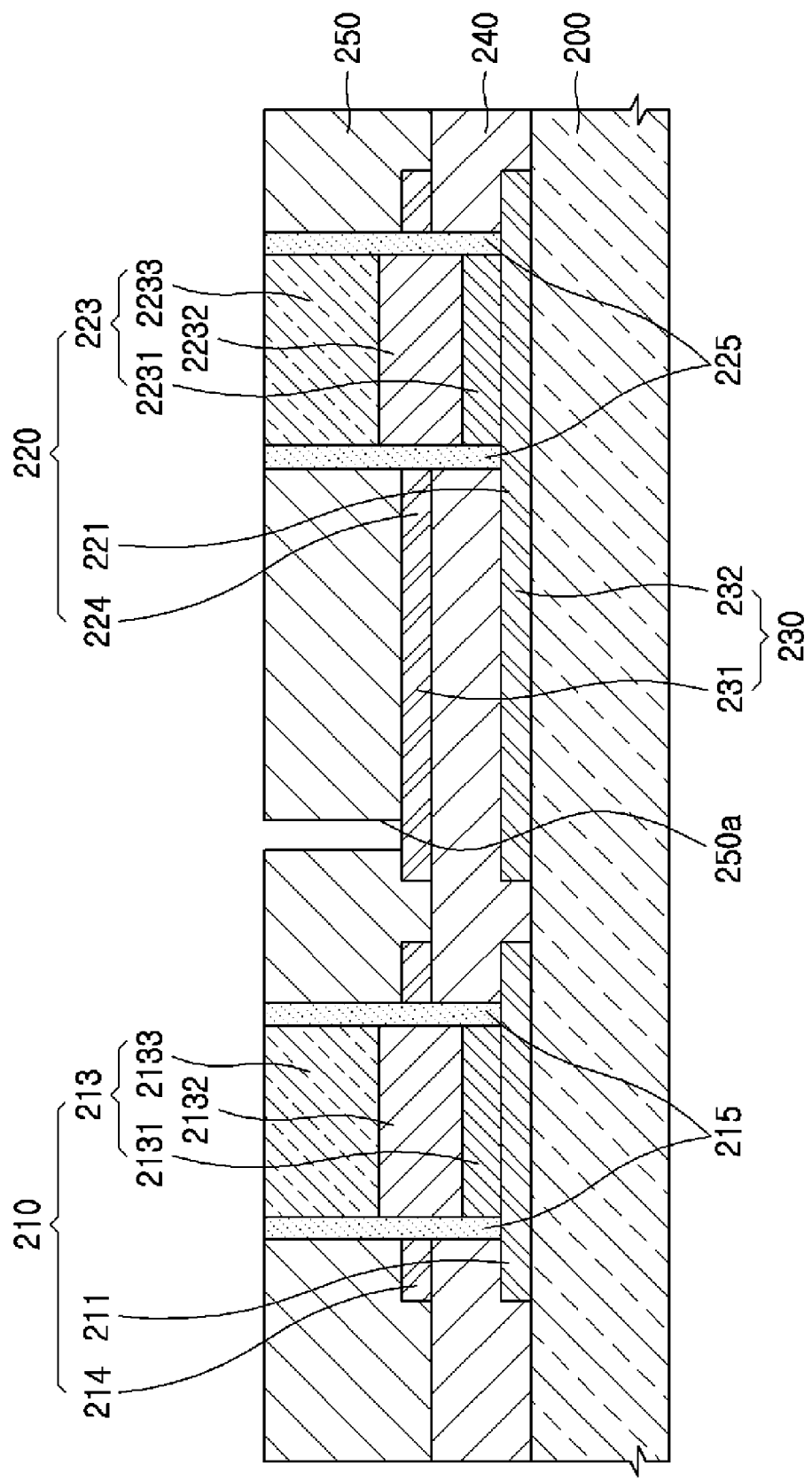

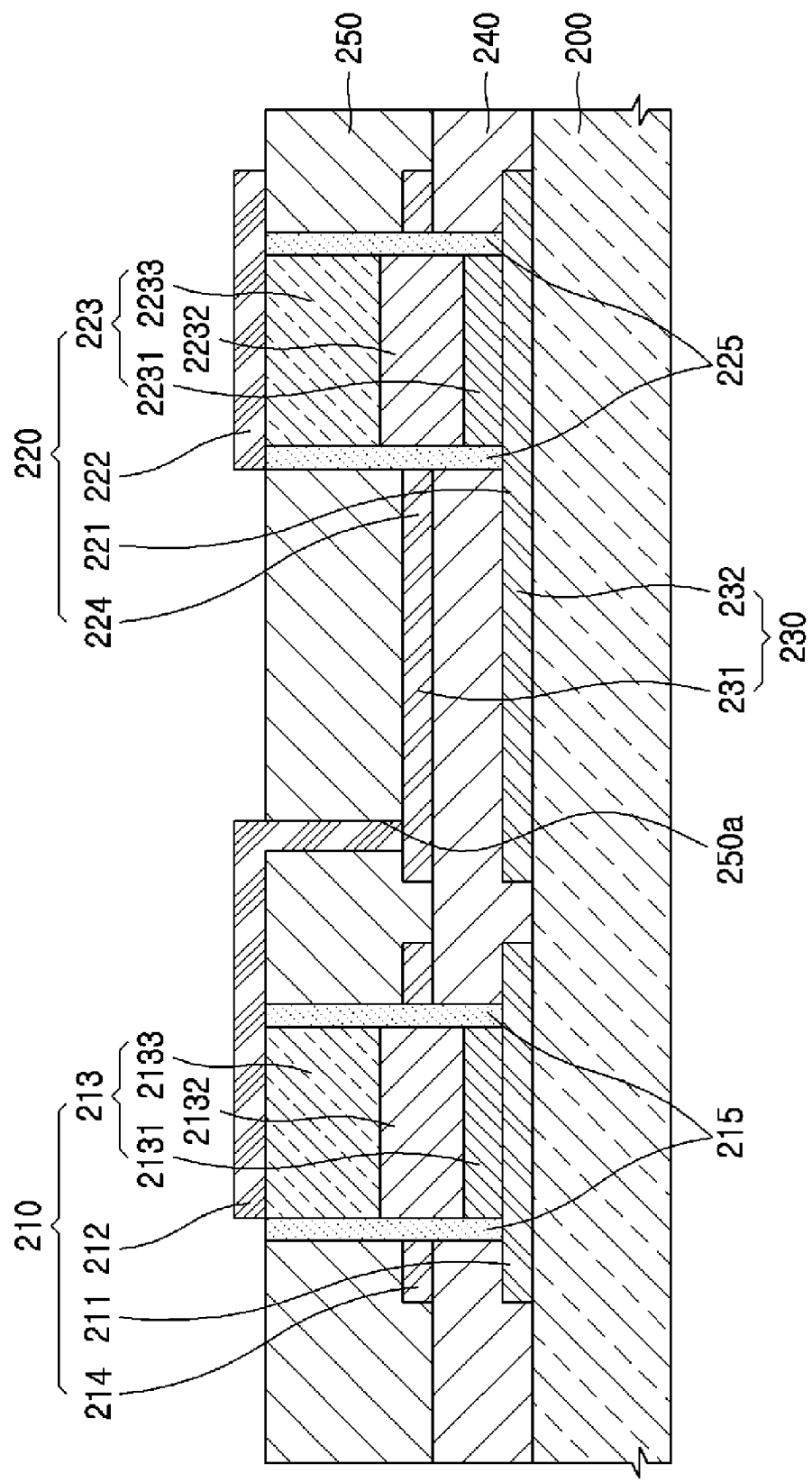

METHOD OF MANUFACTURING AN ORGANIC ELECTROLUMINESCENT DEVICE HAVING ORGANIC LIGHT-EMITTING TRANSISTORS

CROSS-REFERENCE TO RELATED APPLICATIONS

This application is a divisional of U.S. patent application Ser. No. 11/267,740, filed on Nov. 4, 2005, which claims the benefit of Korean Patent Application No. 10-2004-0094179, filed on Nov. 17, 2004, in the Korean Intellectual Property Office, both disclosures of which are incorporated herein by reference.

BACKGROUND OF THE INVENTION

1. Field of the Invention

The present invention relates to an organic electroluminescent (EL) device and a method of manufacturing the same, and more particularly, to an EL device with low manufacturing costs and improved yield due to simplified structure and use of an organic light emitting transistor (OLET) and a method of manufacturing the same.

2. Description of the Related Technology

Flat display devices such as liquid crystal devices, EL devices, or in EL devices are classified into passive matrix (PM) and active matrix (AM) according to their driving methods. In passive matrix flat display devices, anodes and cathodes are arranged in columns and rows, respectively. A row driving circuit supplies a scanning signal to one of the cathodes to select only one row and a column driving circuit supplies a data signal to each pixel of the selected row. Because there are no transistor-capacitor circuits for the pixels, the image is not stored between refresh cycles and the image is less bright and sharp than an active matrix display.

On the other hand, an active matrix flat display device controls a signal input to each pixel using thin film transistors and is suitable for displaying a plurality of images. Accordingly, active matrix display devices are widely used as display devices for displaying a moving picture.

The thin film transistors of active matrix flat display devices each have source and drain regions in which impurities are heavily doped, a semiconductor layer having a channel region between the source and drain regions, a gate electrode which is insulated from the semiconductor layer and is located above the channel region, and source and drain electrodes contacting the source and drain regions, respectively.

The semiconductor layer is often composed of amorphous silicon or poly silicon. Amorphous silicon can be deposited at low temperature, but has electric characteristics that is deteriorated and thus is unreliable and can not easily realize a large-area flat display device. Accordingly, poly silicon is widely used. Since poly silicon has high current mobility of several tens through several hundreds of $cm^2/V \cdot s$, excellent high-frequency operation characteristics, and a low leakage current, it is suitable for a high-precision and large-area flat display device.

However, if the semiconductor layer is made of poly silicon, a process for crystallizing amorphous silicon is required. The crystallizing process must be generally performed at a high temperature of 300° C. In this case, a substrate composed of, for example, a plastic material for realizing a flexible display device can not be used. Accordingly, research into an organic thin film transistor which does not require the crystallizing process has increased.

Flat display devices require high operating speeds and uniform quality in order to process a high quality moving picture. Particularly, in the case of an EL device, a circuit having excellent characteristics must be realized in order to display the moving picture with high quality. That is, in an EL device, a driving element (transistor) is separately provided to each pixel in addition to a switching element (transistor) for switching each pixel. Also, a plurality of thin film transistors may further be included in various compensating circuits associated with the display.

If the EL device has a display unit connected to the circuit having the above-mentioned complicated structure, the manufacturing process thereof is complicated and, the yield thereof is decreased, thus resulting in increased manufacturing costs.

SUMMARY OF CERTAIN INVENTIVE EMBODIMENTS

The present invention provides an EL device with low manufacturing costs and improved yield due to simplified structure and use of an organic light emitting transistor (OLET) and a method of manufacturing the same.

One embodiment includes an organic electroluminescent device including a first organic light emitting transistor including a first source electrode, a first drain electrode, a first intermediate layer including at least an emission layer formed between the first source electrode and the first drain electrode, and a first gate electrode insulated from the first source electrode, the first drain electrode, and the first intermediate layer, the first gate electrode surrounding the first intermediate layer. The embodiment also includes a second organic light emitting transistor including a second source electrode, a second drain electrode, a second intermediate layer including at least an emission layer formed between the second source electrode and the second drain electrode, and a second gate electrode insulated from the second source electrode, the second drain electrode, and the second intermediate layer, the second gate electrode surrounding the second intermediate layer and being connected to the first drain electrode.

Another embodiment includes a method of manufacturing an organic electroluminescent device. The method includes forming a first source electrode and a second source electrode over a substrate, forming a capacitor insulating layer over the substrate to cover at least the first source electrode and the second source electrode, forming first and second gate electrodes over the capacitor insulating layer each having a donut shape, where the location of the first and second gate electrodes correspond to the locations of the first source electrode and the second source electrode, respectively. The method also includes forming a planarization film over the substrate to cover at least the first gate electrode and the second gate electrode, forming a mask of high molecular weight material over the planarization film, forming through-holes in the mask, the planarization film, and the capacitor insulating layer to expose upper surfaces of the first source electrode and the second source electrode and side surfaces of the planarization film, the first gate electrode, the second gate electrode, and the capacitor insulating layer, forming gate insulating films to cover the side surfaces of the planarization film, the first gate electrode, the second gate electrode, and the capacitor insulating layer exposed by the through-holes, forming an intermediate layer including at least an emission layer in each of the through-holes, removing the mask, forming a contact hole in the planarization film to expose a portion of the second gate electrode, and forming over the intermediate layers a first drain electrode in a location corresponding to the location of the first source electrode and a second drain electrode in a location corresponding to location of the second source electrode, where the first drain electrode is connected to the second gate electrode through the contact hole.

Another embodiment includes a method of manufacturing an organic electroluminescent device. The method includes forming a first source electrode and a second source electrode over a substrate, forming a capacitor insulating layer over the substrate to cover at least the first source electrode and the second source electrode, forming first and second gate electrodes over the capacitor insulating layer each having a donut shape, where the location of the first and second gate electrodes correspond to the locations of the first source electrode and the second source electrode, respectively, forming a planarization film over the substrate to cover at least the first gate electrode and the second gate electrode, forming through-holes in the planarization film and the capacitor insulating layer to expose upper surfaces of the first source electrode and the second source electrode and side surfaces of the planarization film the first gate electrode, the second gate electrode, and the capacitor insulating layer. The method also includes forming gate insulating films to cover the side surfaces of the planarization film, the first gate electrode, the second gate electrode, and the capacitor insulating layer exposed by the through-holes, forming an intermediate layer including at least an emission layer in each of the through-holes, forming a contact hole in the planarization film to expose a portion of the second gate electrode, and forming over the intermediate layers a first drain electrode in a location corresponding to the location of the first source electrode and a second drain electrode in a location corresponding to the location of the second source electrode, where the first drain electrode is connected to the second gate electrode through the contact hole.

Another embodiment includes an organic electroluminescent device including a first organic electroluminescent transistor, and a second organic electroluminescent transistor, where the drain of the first organic electroluminescent transistor is connected to the gate of the second organic electroluminescent transistor.

Another embodiment includes an organic electroluminescent device including a first organic electroluminescent transistor configured to selectively emit light according to a first signal, and a second organic electroluminescent transistor configured to selectively connect the first organic electroluminescent transistor to the first signal, where the connectivity is based on a second signal.

Another embodiment includes a method of manufacturing an electroluminescent device, the method including forming a first organic electroluminescent transistor, configuring the first organic electroluminescent transistor to selectively emit light according to a first signal, forming a second organic electroluminescent transistor, and configuring the second organic electroluminescent transistor to selectively connect the first organic electroluminescent transistor to the first signal, where the connectivity is based on a second signal.

Another embodiment includes a method of using an electroluminescent device. The method includes driving a data signal to a first organic electroluminescent transistor, and driving a control signal to the first organic electroluminescent transistor, where the state of a first organic electroluminescent transistor changes so as to connect the data signal to a second organic electroluminescent transistor, and where the luminescence of the second organic electroluminescent transistor substantially changes.

BRIEF DESCRIPTION OF THE DRAWINGS

The above and other features and advantages of certain inventive aspects are discussed with further detailed exemplary embodiments with reference to the attached drawings in which:

FIGS. 14 through 19 are cross-sectional views schematically illustrating a method of manufacturing an EL device according to another embodiment.

DETAILED DESCRIPTION OF CERTAIN INVENTIVE EMBODIMENTS

Exemplary embodiments will now be described more fully with reference to the accompanying drawings.

Figure 1:
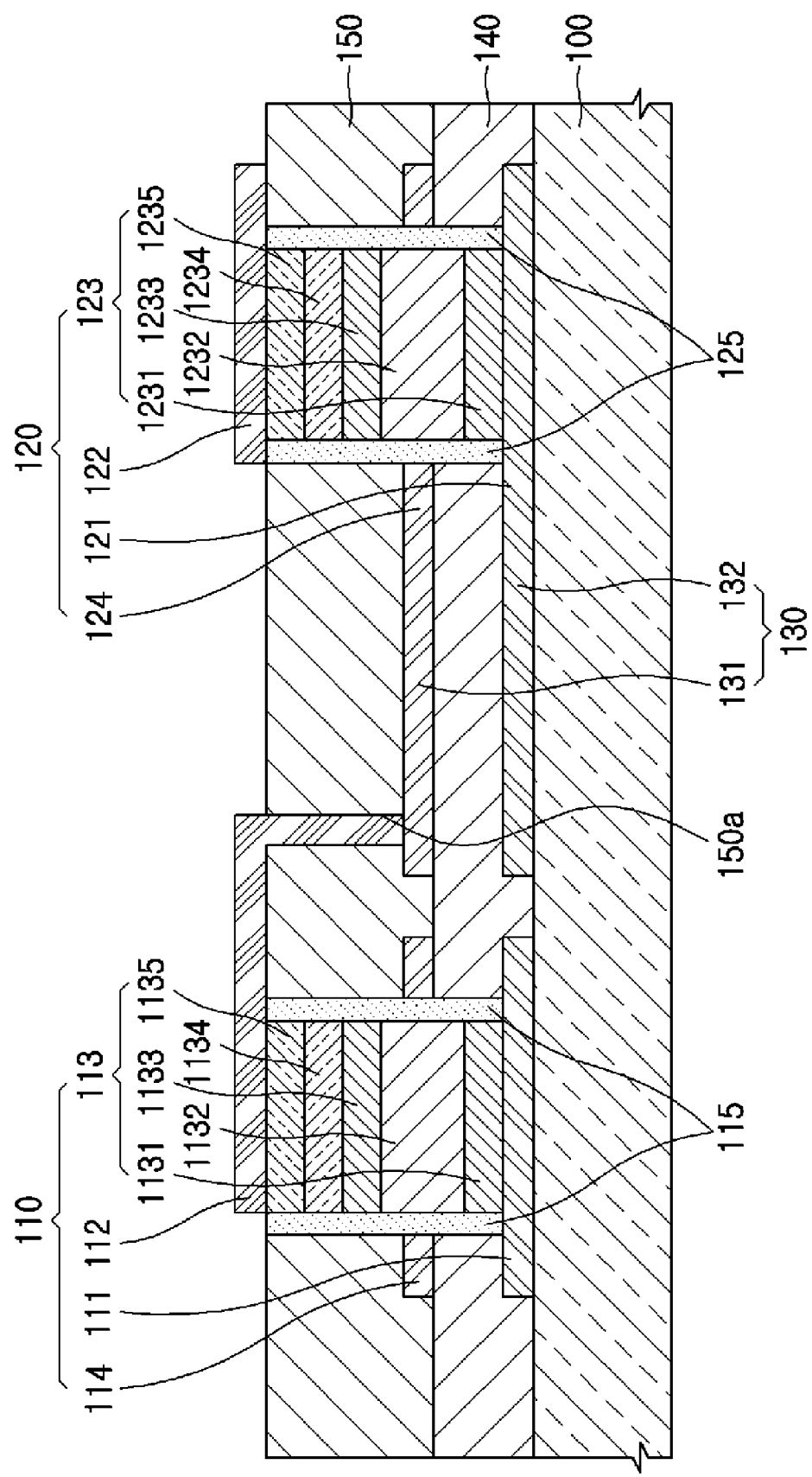
FIG. 1 is a cross-sectional view of an EL device according to an embodiment.
Figure 2:
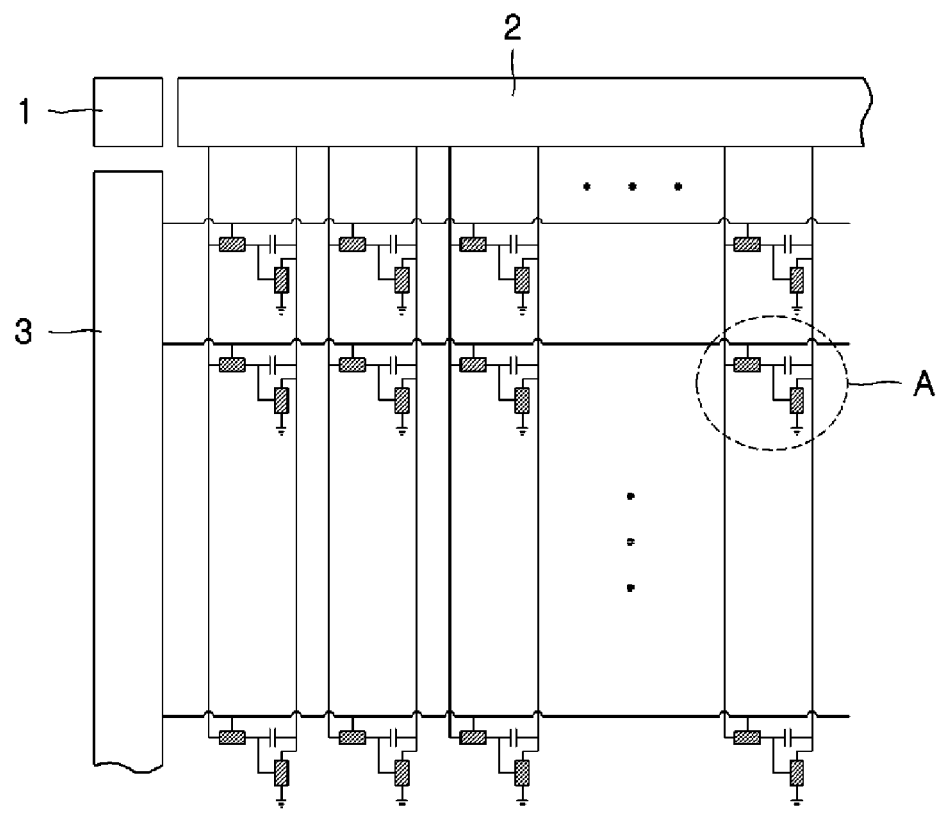
FIG. 2 is a circuit diagram of a display device using the EL device shown in FIG. 1.
Figure 3:
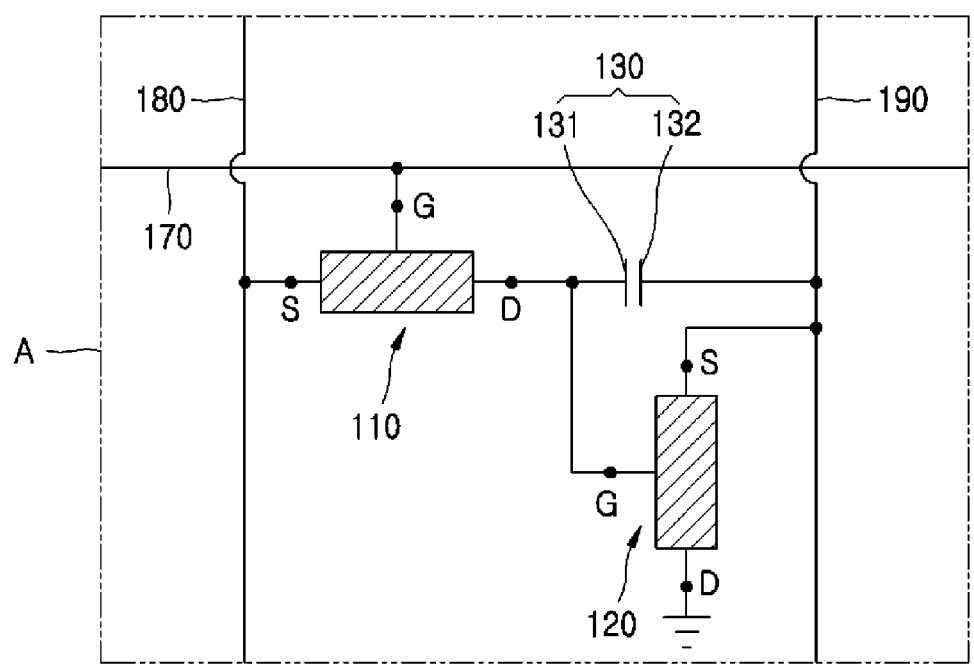
FIG. 3 is a circuit diagram of a portion "A" shown in FIG. 2.
Figure 4:
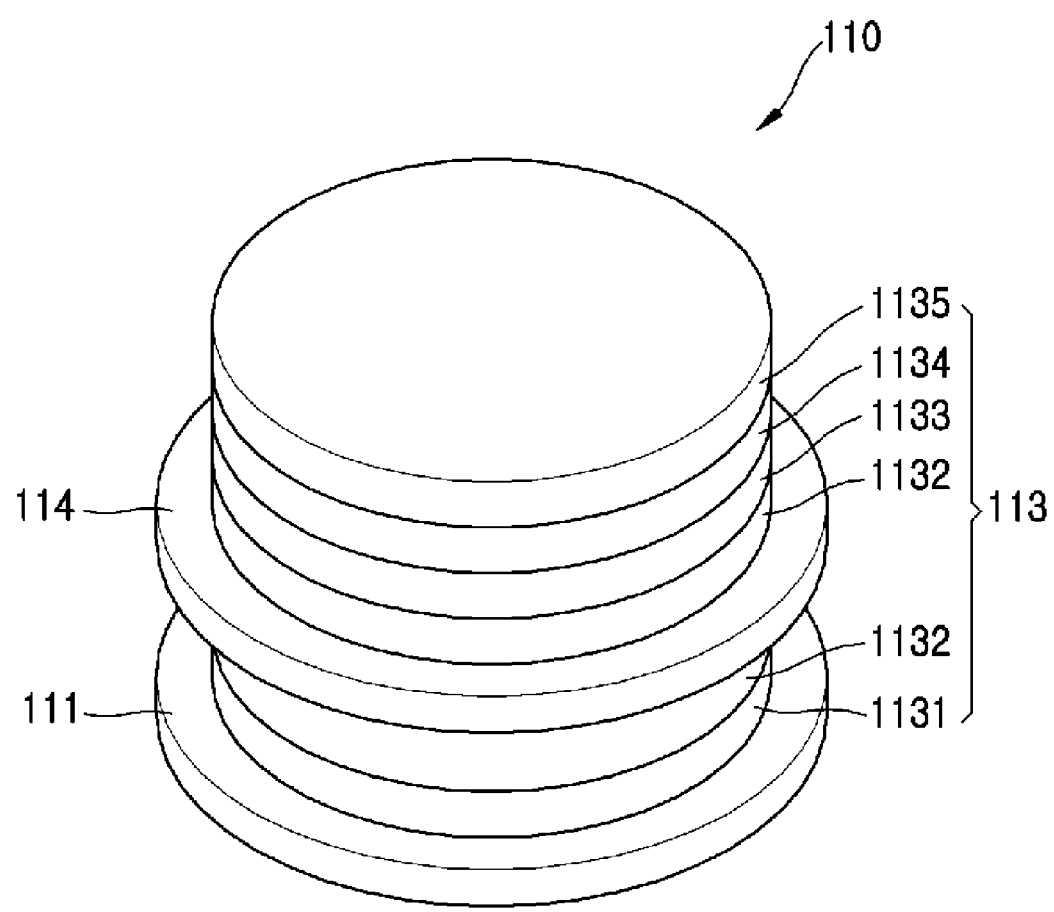
FIG. 4 is a perspective view of an organic light emitting transistor included in the EL device shown in FIG. 1.

FIG. 1 is a cross-sectional view of an organic electroluminescent EL device according to an embodiment, FIG. 2 is a circuit diagram of a display device using the EL device shown in FIG. 1, FIG. 3 is a circuit diagram of a portion "A" shown in FIG. 2, and FIG. 4 is a perspective view of an organic light emitting transistor included in the EL device shown in FIG. 1.

Hereinafter, the structure of the EL device of the present embodiment will be described with reference to the drawings.

A first organic light emitting transistor 110 and a second organic light emitting transistor 120 are electrically connected to each other on a common substrate 100. The substrate may, for example, be formed of plastic or glass. The first organic light emitting transistor 110 includes a first source electrode 111, a first drain electrode 112, a first intermediate layer 113, and a first gate electrode 114. The first source electrode 111 and the first drain electrode 112 are on opposite sides of the intermediate layer 113. The first intermediate layer 113 is disposed between the first source electrode 111 and the first drain electrode 112 and has at least an emission layer 1133. The first gate electrode 114 is insulated from the first source electrode 111, the first drain electrode 112, and the first intermediate layer 113 and surrounds the first intermediate layer 113.

The second organic light emitting transistor 120 includes a second source electrode 121, a second drain electrode 122, a second intermediate layer 123, and a second gate electrode 124. The second source electrode 121 and the second drain electrode 122 are opposite to each other. The second intermediate layer 123 is disposed between the second source electrode 121 and the second drain electrode 122 and has at least an emission layer 1233. The second gate electrode 124 is insulated from the second source electrode 121, the second drain electrode 122, and the second intermediate layer 123 and surrounds the second intermediate layer 123. The first drain electrode 112 is connected to the second gate electrode 124.

Referring to FIG. 1, the first source electrode 111 and the second source electrode 121 may be formed in the same layer, the first drain electrode 112 and the second drain electrode 122 may be formed in the same layer, and the first gate electrode 114 and the second gate electrode 124 may be formed in the same layer.

The source electrodes 111 and 121 may comprise transparent materials such as ITO, IZO, ZnO or $In_2O_3$. If the source electrodes 111 and 121 are used as reflective electrodes, they may comprise reflective films such as Ag, Mg, Al, Pt, Pd, Au, Ni, Nd, Ir, Cr or a combination thereof with transparent materials such as ITO, IZO, ZnO or $In_2O_3$ formed thereon.

The drain electrodes 112 and 122 may include a thin metal layer made of material having a small work function, such as Li, Ca, LiF/Ca, LiF/Al, Al, Ag, or Mg or a combination thereof, deposited toward the intermediate layers 113 and 123 and Other electrode layers or bus electrode lines made of a material for forming a transparent electrode such as ITO, IZO, ZnO or $In_2O_3$ may be formed on the metal. When the drain electrodes 112 and 122 are used as reflective electrodes, they may be made of a metal such as Li, Ca, LiF/Ca, LiF/Al, Al, Ag, or Mg or a combination thereof. The electrodes are not limited to these materials, and the source electrodes 111 and 121 and the drain electrodes 112 and 122 may also be made of organic materials such as a conductive polymer.

A capacitor 130 may further be included in the EL device. The capacitor 130 includes a first capacitor electrode 131 and a second capacitor electrode 132. The first capacitor electrode 131 is connected to the second gate electrode 124, and the second capacitor electrode 132 is connected to the second source electrode 121. The first capacitor electrode 131 may be integrally formed with the second gate electrode 124 and the second capacitor electrode 132 may be integrally formed with the second source electrode 121.

A capacitor insulating layer 140 is formed between the first capacitor electrode 131 and the second capacitor electrode 132. Accordingly, the capacitor insulating layer 140 is formed between a layer including the first gate electrode 114 and the second gate electrode 124 and a layer including the first source electrode 111 and the second source electrode 121, referring to FIG. 1. The capacitor insulating layer 140 may be made of an inorganic material or an organic material.

A planarization film 150 may further be formed on the first gate electrode 114 and the second gate electrode 124, which are formed on the capacitor insulating layer 140. The first drain electrode 112 and the second drain electrode 122 may be formed on the planarization film 150. In order to connect the first drain electrode 112 with the second gate electrode 124, a contact hole 150a is formed in the planarization film 150. That is, the first drain electrode 112 is connected to the second gate electrode 124 through the contact hole 150a.

The first intermediate layer 113 may have various shapes, for example, it may have a cylindrical shape of which a central axis extends from the first source electrode 111 to the first drain electrode 112. Also, the second intermediate layer 123 may be formed in various shapes, for example, it may have a cylindrical shape of which a central axis extends from the second source electrode 121 to the second drain electrode 122. The intermediate layers 113 and 123 may also have another shape such as a parallelepiped shape or an irregular shape. In the embodiments described below, it is assumed for convenience that the intermediate layer 123 has a cylindrical shape.

As mentioned above, the first gate electrode 114 is insulated from the first source electrode 111, the first drain electrode 112, and the first intermediate layer 113, and has a donut shape surrounding the first intermediate layer 113. Accordingly, in order to insulate the first gate electrode 114 from the first source electrode 111, the first drain electrode 112, and the first intermediate layer 113, a gate insulating film 115 may further be formed between the first intermediate layer 113 and the first gate electrode 114. Similarly, a gate insulating film 125 may further be formed between the second intermediate layer 123 and the second gate electrode 124.

If the first intermediate layer 113 and the second intermediate layer 123 have the cylindrical shapes as mentioned above, the gate insulating films 115 and 125 have donut shapes so as to surround the side surfaces of the first intermediate layer 113 and the second intermediate layer 123.

The intermediate layers 113 and 123 may be made of low molecular weight materials. In FIG. 1, the intermediate layers 113 and 123 respectively include hole injection layers (HIL) 1131 and 1231, hole transport layers (HTL) 1132 and 1232, emission layers (EML) 1133 and 1233, hole blocking layers (HBL) 1134 and 1234, and electron transport layers (ETL) 1135 and 1235 formed between the source electrodes 111 and 121 and the drain electrodes 112 and 122. The organic material of the intermediate layer 113 or 123 may include copper phthalocyanine (CuPc), N,N'-di(naphthalene-1-yl)-N,N'-diphenyl-benzidine (NPB), tris-8-hydroxyquinoline aluminum ($Alq_3$), or the like. The intermediate layers 113 and 123 may have the other structures. The same is true in the subsequently-described embodiments.

Referring to FIG. 1, the intermediate layers 113 and 123 include at least the hole transport layers 1132 and 1232, respectively. The first gate electrode 114 may surround the hole transport 1132 of the first intermediate layer 113 and the second gate electrode 124 may surround the hole transport layer 1232 of the second intermediate layer 123. In this case, the second gate electrode 124 may completely or partially surround the hole transport layer 1232. The same is true in the subsequently-described embodiments. In this case, the hole transport layers 1132 and 1232 function as the semiconductor layers. Alternatively, the intermediate layers 113 and 123 may include at least the hole injection layers 1131 and 1231, the first gate electrode 114 may surround the hole injection layer 1131 of the first intermediate layer 113, and the second gate electrode 124 may surround the hole injection layer 1231 of the second intermediate layer 123. Alternatively, the intermediate layers 113 and 123 may include at least the hole blocking layers 1134 and 1234, the first gate electrode 114 may surround the hole blocking layer 1134 of the first intermediate layer 113, and the second gate electrode 124 may surround the hole blocking layer 1234 of the second intermediate layer 123. Alternatively, the intermediate layers 113 and 123 may include at least the electron transport layers 1135 and 1235, the first gate electrode 114 may surround the electron transport layer 1135 of the first intermediate layer 113, and the second gate electrode 124 may surround the electron transport layer 1235 of the second intermediate layer 123. The location of the intermediate layer or the location of the gate electrode may be changed. The same is true in the subsequently-described embodiments.

The operating principle of the EL device having the above-mentioned structure will now be described with reference to FIG. 3.

If a scan signal is applied by a driving circuit to the first gate electrode 114 of the first organic light emitting transistor 110 connected to a first wire 170, a conductive channel is formed in the hole transport layer 1132 of the intermediate layer 113 surrounded by the first gate electrode 114. In this case, if a data signal is applied to the first source electrode 111 of the first organic light emitting transistor 110 through a second wire 180, the data signal is applied to the capacitor 130 and the second gate electrode 124 of the second organic light emitting transistor 120 through the first drain electrode 112 of the first organic light emitting transistor 110. Thus, a conductive channel is formed in the hole transport layer 1232 of the intermediate layer 123 of the second organic light emitting transistor 120. An electric signal from a third wire 190 is adjusted to adjust the amount of light generated in the intermediate layer 123 including the emission layer 1233 of the second organic light emitting transistor 120. Thus, the first organic light emitting transistor 110 acts as a transistor to connect the data signal placed on the second wire 180 to the second organic light emitting transistor 120, which acts as an electroluminescent display element.

In the above-mentioned driving method, the first wire 170 is a scan line, the second wire 180 is a data line, and the third wire 190 is a power supply line (Vdd line).

As mentioned above, the EL device can be realized without using a separate thin film transistor, that is, only using the organic light emitting transistor, and thus the structure of the EL device and the manufacturing process thereof can be simplified. Accordingly, the manufacturing costs can be reduced and the yield can be improved.

Figure 5:
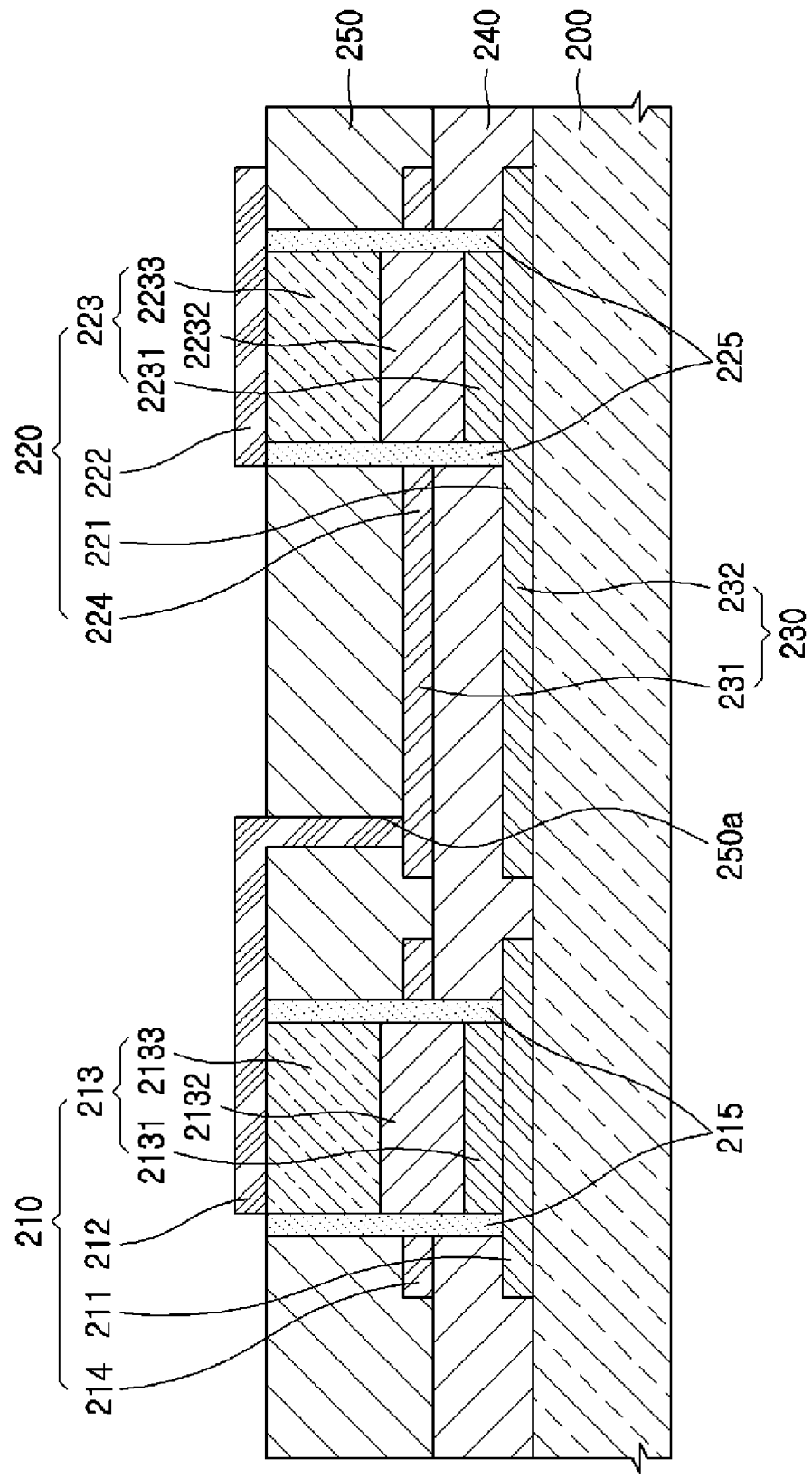
FIG. 5 is a cross-sectional view of an EL device according to another embodiment.
Figure 6:
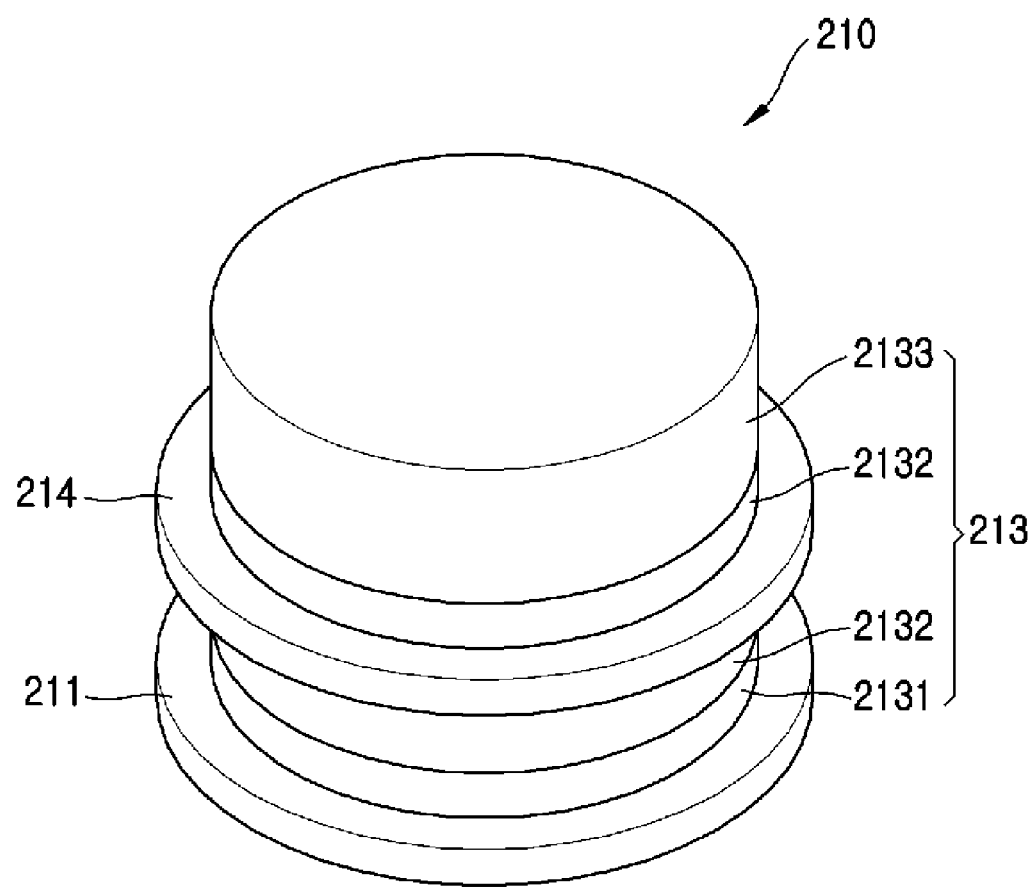
FIG. 6 is a perspective view of a portion of an organic light emitting transistor included in the EL device shown in FIG. 5.

FIG. 5 is a cross-sectional view of an EL device according to another embodiment, and FIG. 6 is a perspective view of a portion of an organic light emitting transistor included in the EL device shown in FIG. 5.

The present embodiment is different from the above-mentioned embodiment in the structure of intermediate layers 213 and 223.

While the intermediate layers 113 and 123 included in the EL devices 110 and 120 are made of the low molecular weight organic materials in the above-mentioned embodiments, the intermediate layers 213 and 223 included in the EL devices 210 and 220 are made of high molecular weight organic materials in the present embodiment. In the present embodiment, the intermediate layers 213 and 223 may include hole transport layers 2132 and 2232 and emission layers 2133 and 2233. The hole transport layer may be made of PEDOT and the emission layer may be made of a high molecular weight organic material such as poly-phenylenevinylene or polyfluorene. Other layers may further be included in the intermediate layer 213 and 223 and other materials may be used.

In some embodiments, the EL device can be realized without using a separate thin film transistor, that is, only using the organic light emitting transistor, and thus the structure of the EL device and the manufacturing process thereof can be simplified. Accordingly, the manufacturing costs can be reduced and the yield can be improved.

FIGS. 7 through 13 are cross-sectional views schematically illustrating an exemplary method of manufacturing an EL device according to an embodiment. Modifications to the example may be made resulting in alternate embodiments of the method which would generate various embodiments of the EL device.

Figure 7:
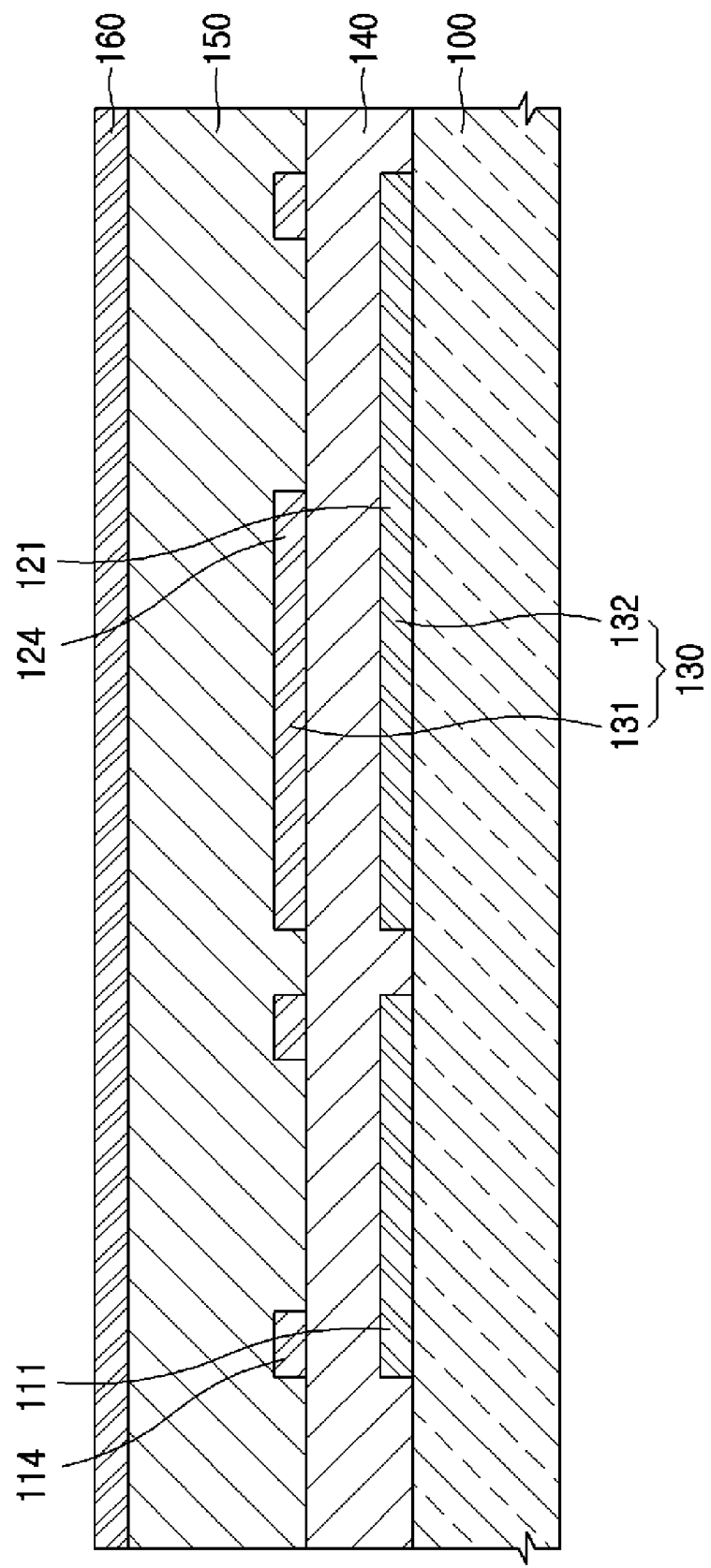
FIGS. 7 through 13 are cross-sectional views schematically illustrating a method of manufacturing an EL device according to an embodiment.

Referring to FIG. 7, a first source electrode 111 and a second source electrode 121 are formed on a substrate 100 which is made of glass or plastic. Predetermined patterning is then performed using photolithography. Next, a capacitor insulating layer 140 is formed on the entire surface of the substrate 100 so as to cover the first source electrode 111 and the second source electrode 121. The capacitor insulating layer 140 may made of an organic material or inorganic material. A first gate electrode 114 and a second gate electrode 124 having donut shapes are formed on the capacitor insulating layer 140 above the first source electrode 111 and the second source electrode 121, respectively. The deposition is performed using a fine metal mask and predetermined patterning is performed using photolithography. After forming the first gate electrode 114 and the second gate electrode 124, a planarization film 150 is formed on the entire surface of the substrate 100 so as to cover the first gate electrode 114 and the second gate electrode 124, and a mask of high molecular weight material 160 is formed on the planarization film 150.

Figure 8:
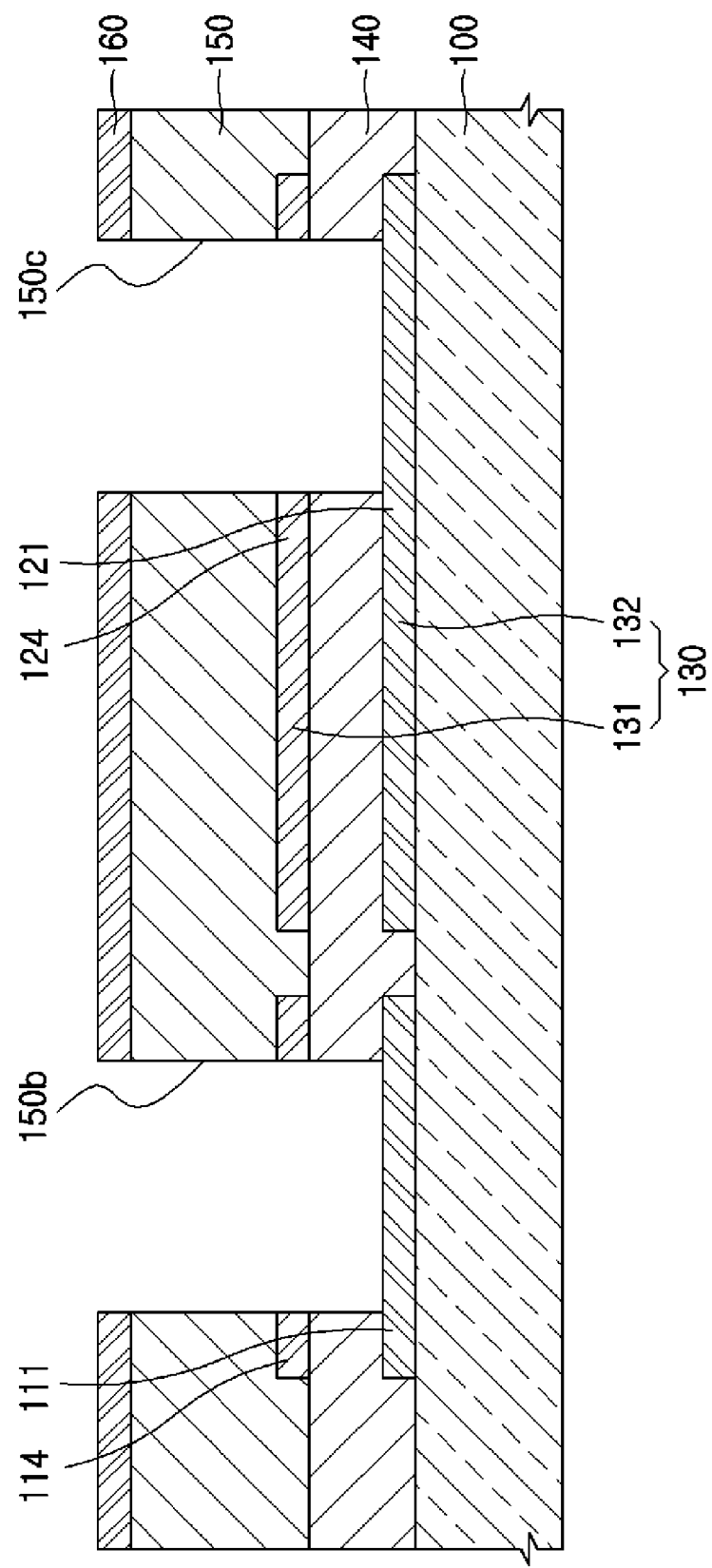

Subsequently, referring to FIG. 8, through-holes 150b and 150c are formed in the mask of high molecular weight material 160, the planarization film 150, and the capacitor insulating layer 140 to expose the upper surfaces of the first source electrode 111 and the second source electrode 121 and the side surfaces of the first gate electrode 114 and the second gate electrode 124. In order to form the through-holes 150b and 150c, laser ablation technology (LAT) may be used.

Figure 9:
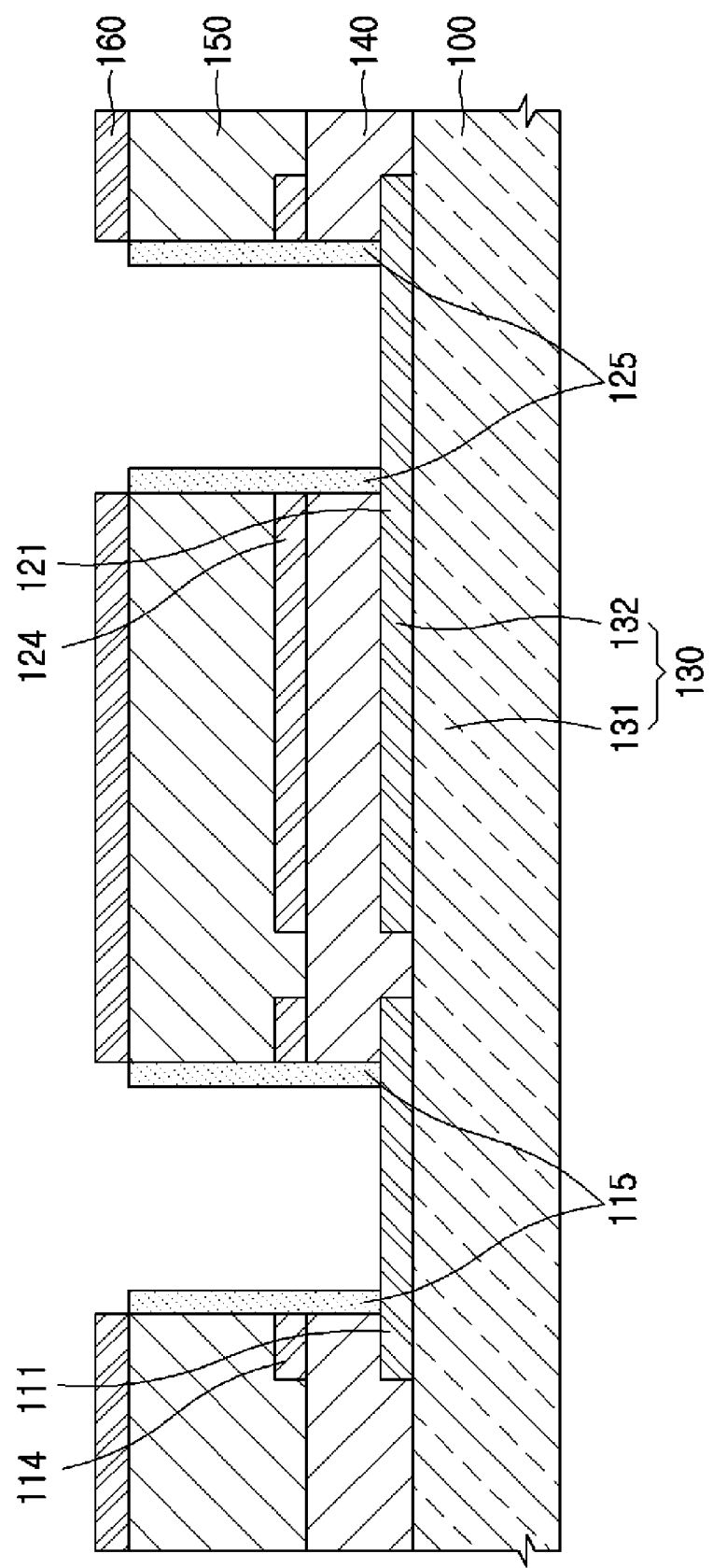

Next, referring to FIG. 9, gate insulating films 115 and 125 are formed to cover the side surfaces of the planarization film 150, the first gate electrode 114, the second gate electrode 124, and the capacitor insulating layer 140 exposed by the through-holes 150b and 150c. The gate insulating films 115 and 125 can be formed by oxidizing the surfaces of the planarization film 150, the first gate electrode 114, the second gate electrode 124, and the capacitor insulating layer 140 exposed by the through-holes 150b and 150c. In this case, the gate insulating films 115 and 125 can be formed, for example, by performing an $O_2$ plasma treatment or $H_2O_2$ treatment. Other methods may also be used.

Figure 10:
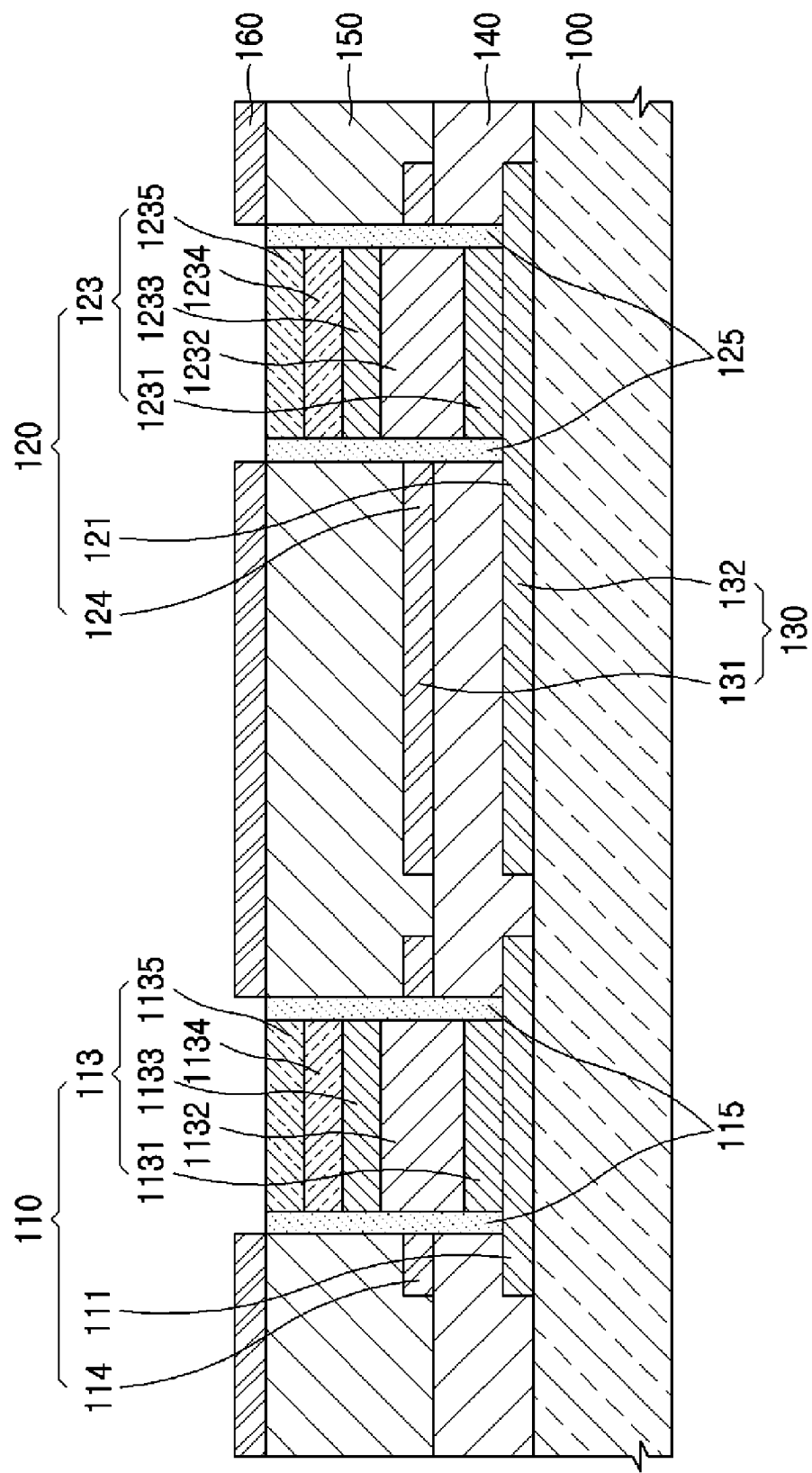

Next, referring to FIG. 10, a low molecular weight material is deposited using the mask of high molecular weight material 160 to form intermediate layers 113 and 123 including at least emission layers in the through-holes 150b and 150c, respectively. The shapes and kinds of the intermediate layers are not limited to those shown in FIGS. 11 through 13.

Figure 11:
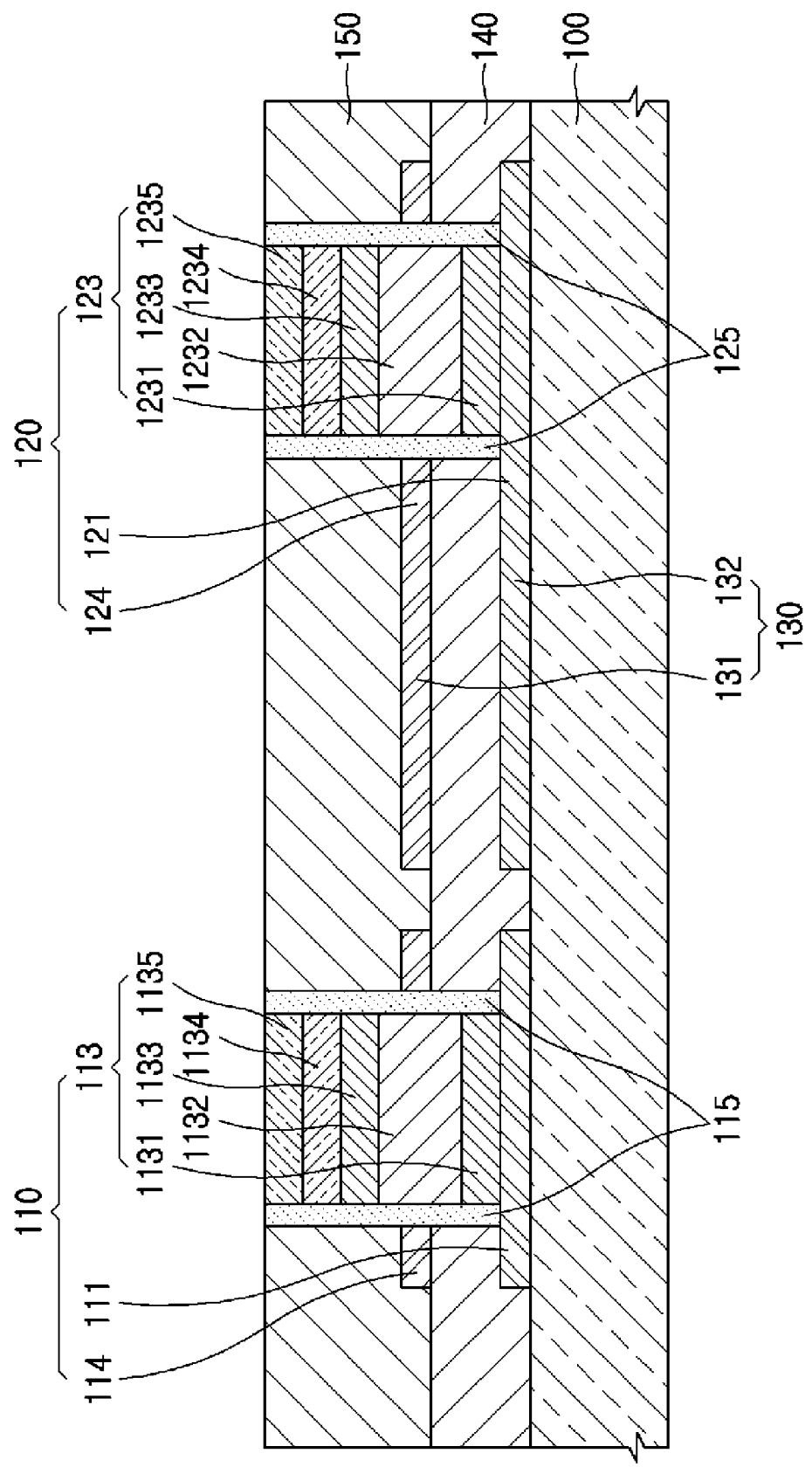
Figure 12:
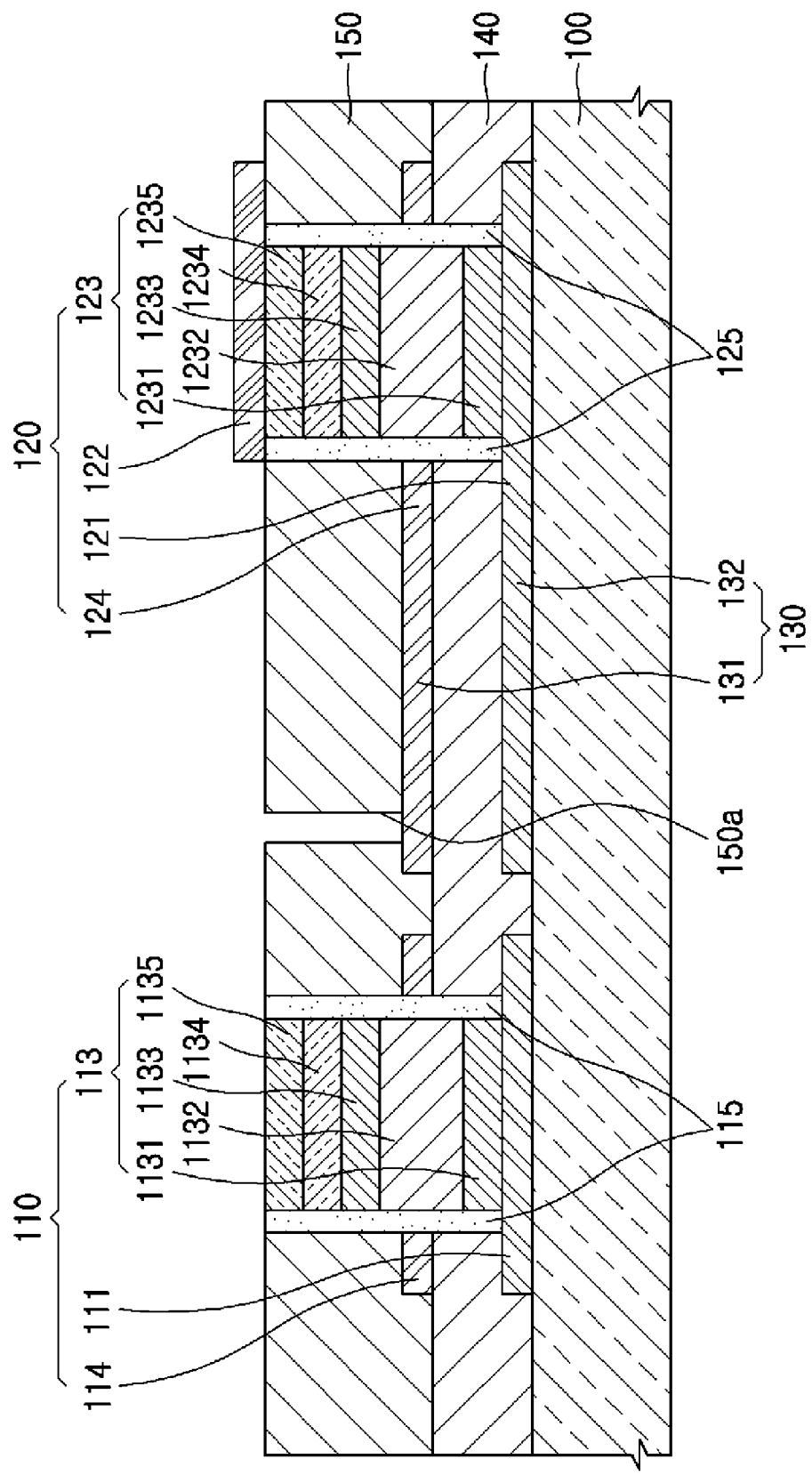
Figure 13:
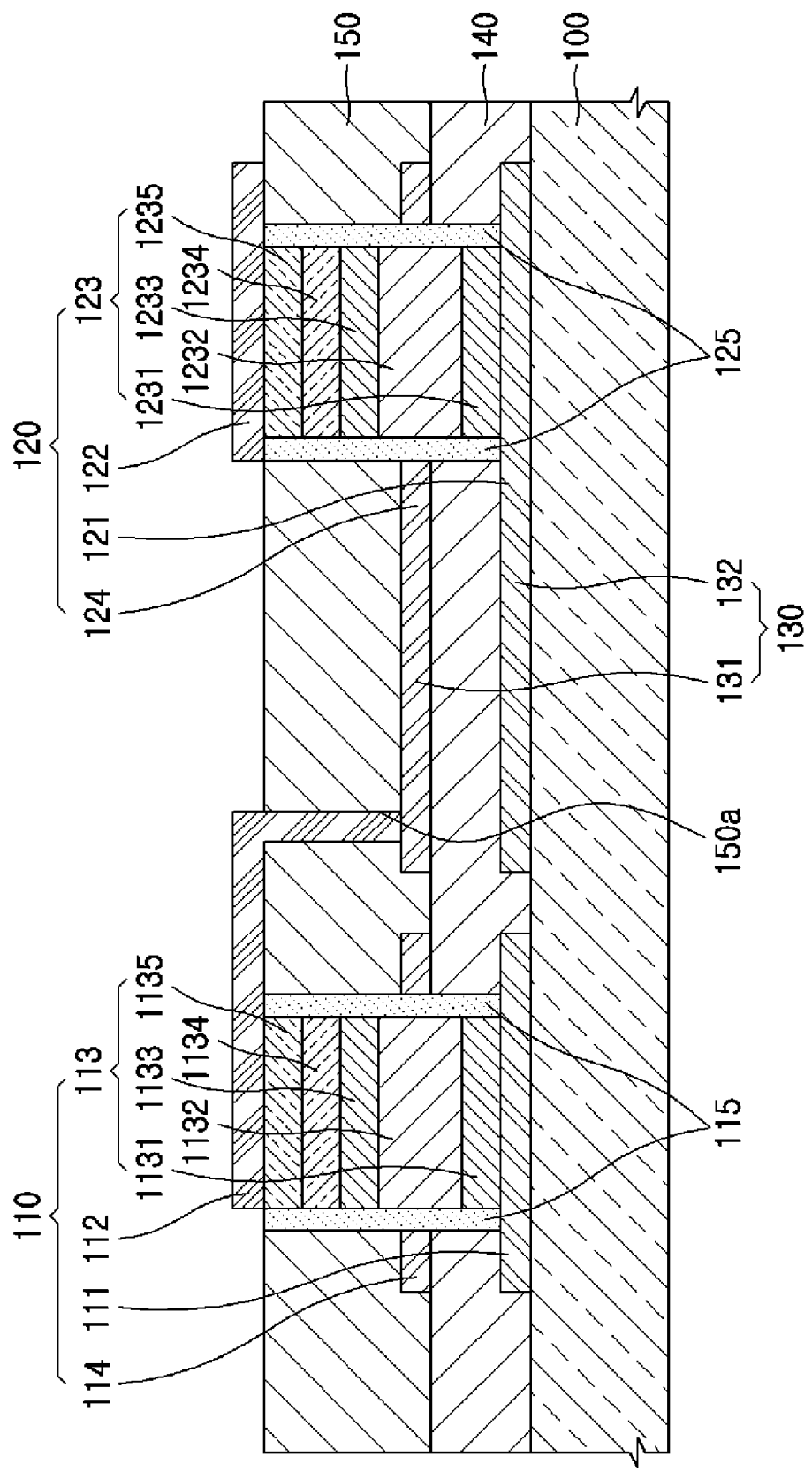

Referring to FIG. 11, the mask of high molecular weight material 160 is removed and, referring to FIG. 12, a contact hole 150a is formed in the planarization film 150 to expose a portion of the second gate electrode 124. Finally, a first drain electrode 112 corresponding to the first source electrode 111 and a second drain electrode 122 corresponding to the second source electrode 121 are formed on the intermediate layer 113 and 123 so that the first drain electrode 112 is connected to the gate electrode 124 through the contact hole 150a. Accordingly, the EL device is completed, referring to FIG. 13.

By the above-mentioned process, the EL device can be realized without using a separate thin film transistor, that is, only using the organic light emitting transistor, and thus the structure of the EL device and the manufacturing process thereof can be simplified. Accordingly, the manufacturing costs can be reduced and the yield can be improved.

FIGS. 14 through 19 are cross-sectional views schematically illustrating another method of manufacturing an EL device according to another embodiment.

Figure 14:
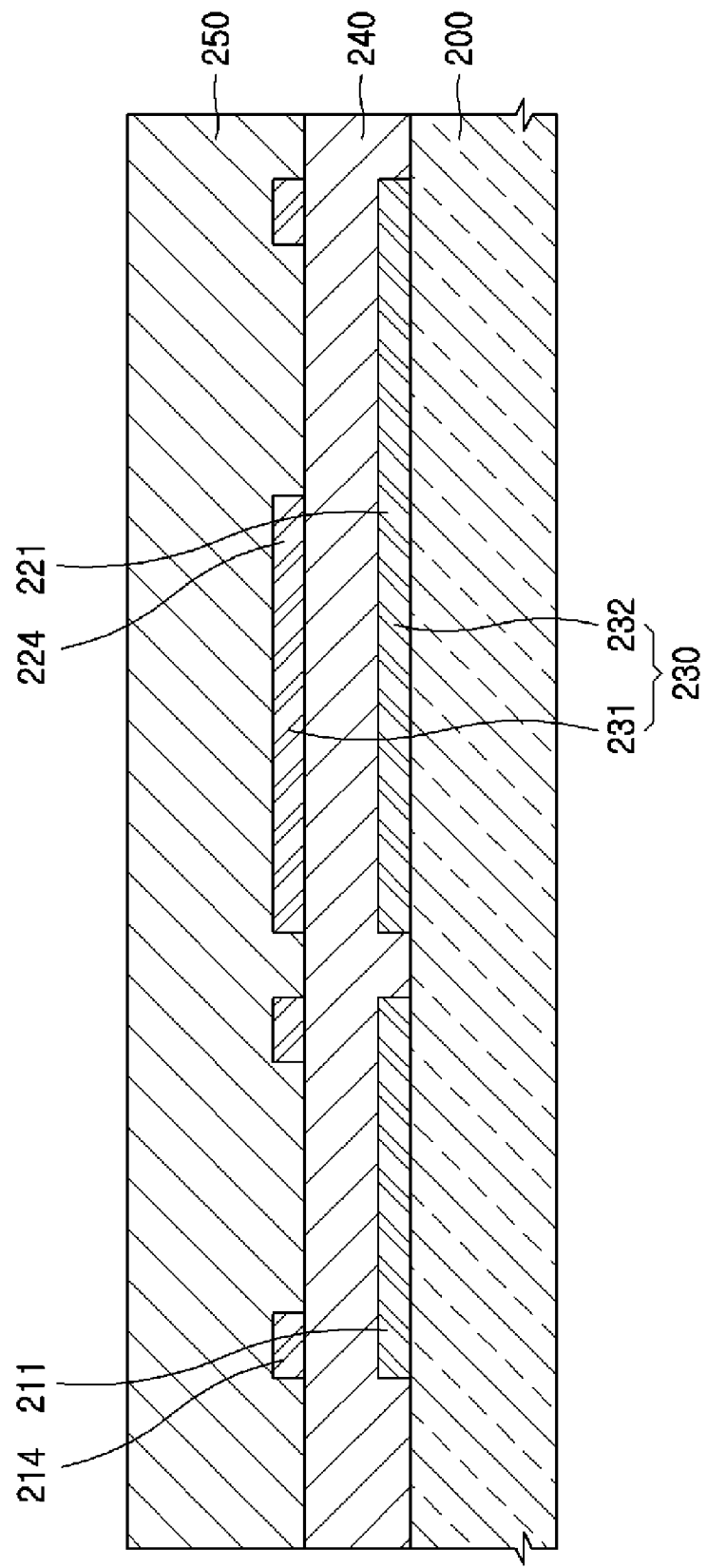

Referring to FIG. 14, a first source electrode 211 and a second source electrode 221 are formed on a substrate 200 which is made of glass or plastic. Predetermined patterning is then performed using photolithography. Next, a capacitor insulating layer 240 is formed on the entire surface of the substrate 200 so as to cover the first source electrode 211 and the second source electrode 221. The capacitor insulating layer 240 may be made of an organic material or an inorganic material. A first gate electrode 214 and a second gate electrode 224 having donut shapes are formed on the capacitor insulating layer 240 above the first source electrode 211 and the second source electrode 221, respectively. The deposition is performed using a fine metal mask and predetermined patterning is performed using photolithography. After forming the first gate electrode 214 and the second gate electrode 224, a planarization film 250 is formed on the entire surface of the substrate 200 so as to cover the first gate electrode 214 and the second gate electrode 224.

Figure 15:
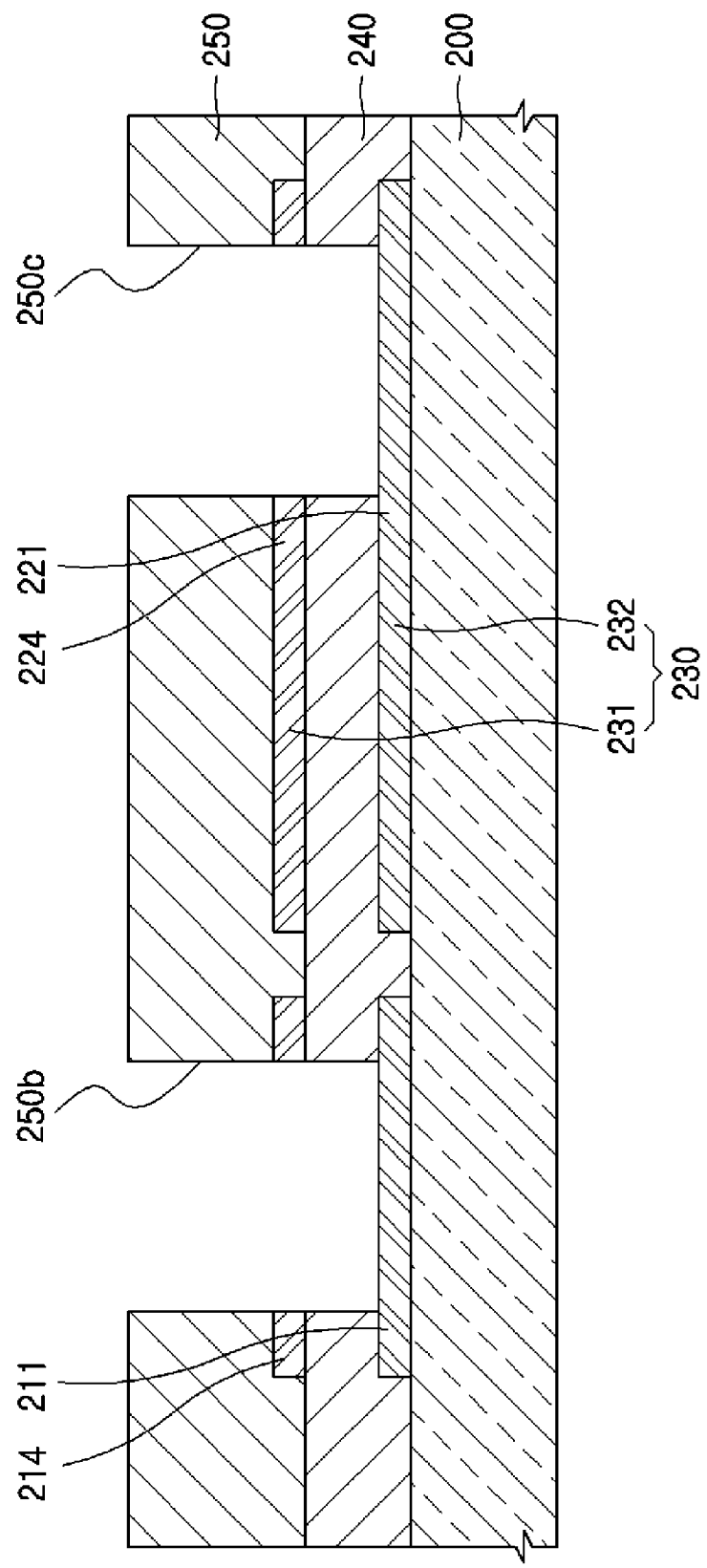

Subsequently, referring to FIG. 15, through-holes 250b and 250c are formed in the planarization film 250 and the capacitor insulating layer 240 to expose the upper surfaces of the first source electrode 211 and the second source electrode 221 and the side surfaces of the first gate electrode 214 and the second gate electrode 224. In order to form the through-holes 250b and 250c, laser ablation technology (LAT) may be used.

Figure 16:
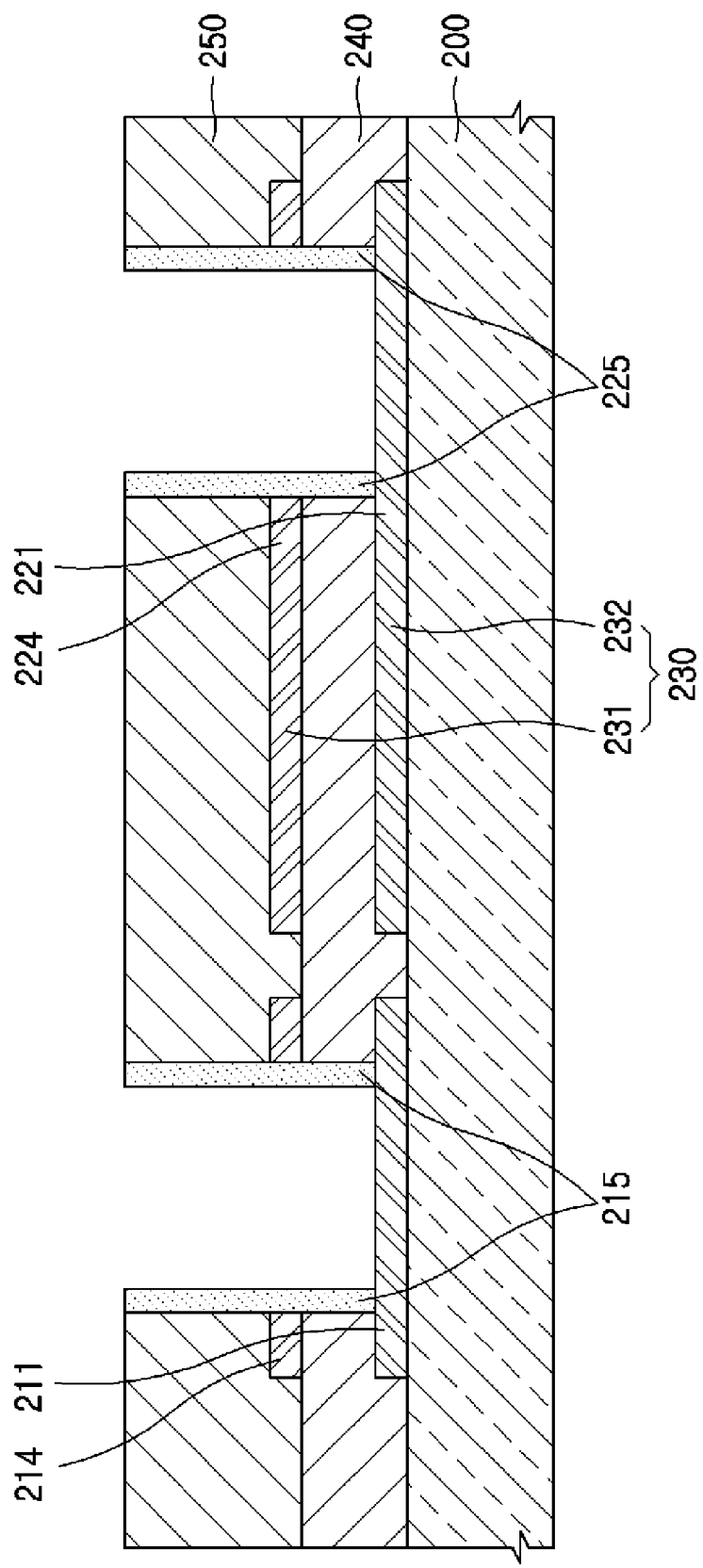

Next, referring to FIG. 16, gate insulating films 215 and 225 are formed so as to cover the side surfaces of the planarization film 250, the first gate electrode 214, the second gate electrode 224, and the capacitor insulating layer 240 exposed by the through-holes 250b and 250c. The gate insulating films 215 and 225 can be formed by oxidizing the surfaces of the planarization film 250, the first gate electrode 214, the second gate electrode 224, and the capacitor insulating layer 240 exposed by the through-holes 250b and 250c. In this case, the gate insulating films 215 and 225 can be formed by performing an $O_2$ plasma treatment or $H_2O_2$ treatment, but other methods may be also used.

Figure 17:
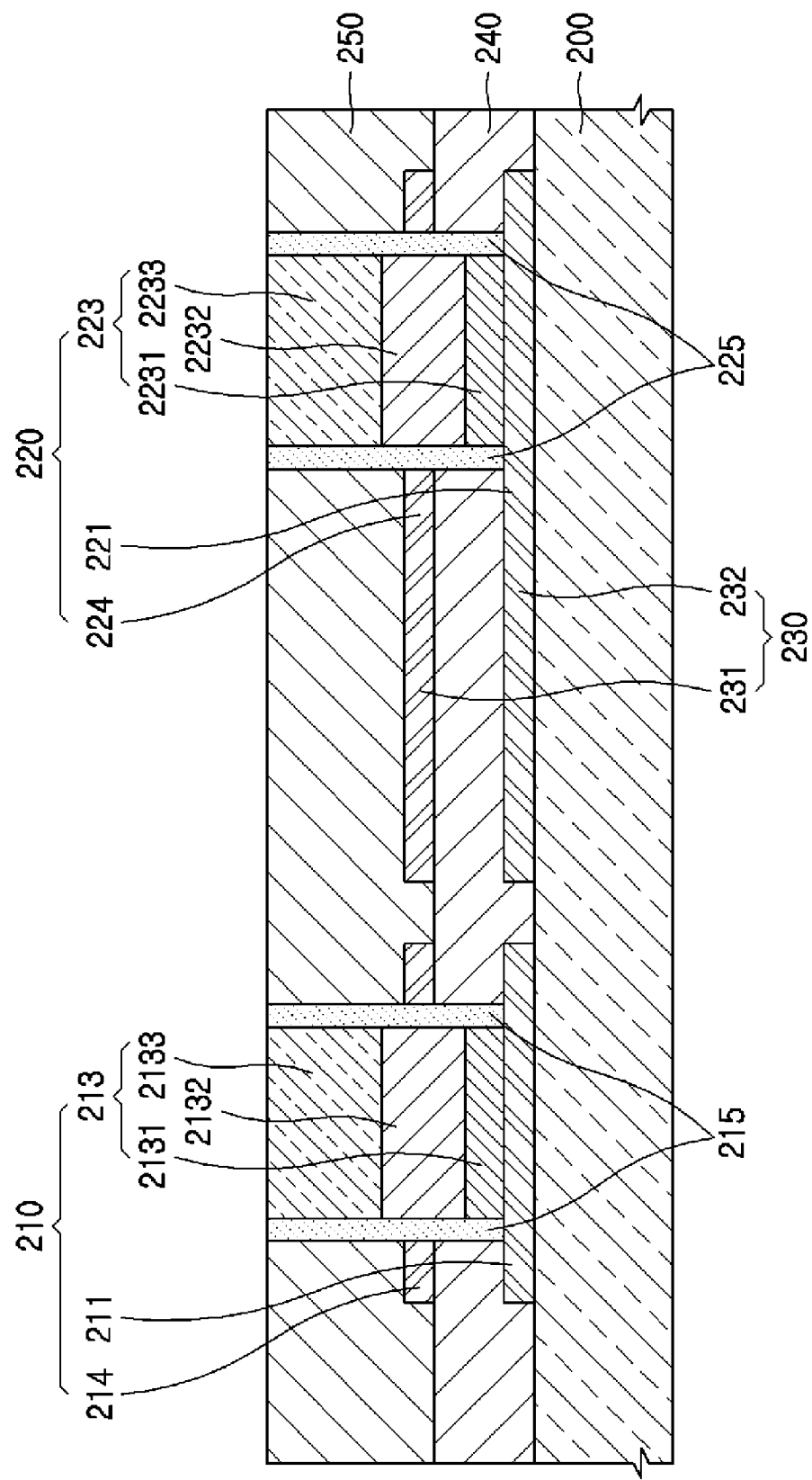

Next, referring to FIG. 17, a high molecular weight material is deposited using an inkjet printing method to form intermediate layers 213 and 223 including at least emission layers in the through-holes 250b and 250c, respectively. The shapes and kinds of the intermediate layers are not limited to those shown in FIGS. 17 through 19.

Referring to FIG. 18, a contact hole 250a is formed in the planarization film 250 such that a portion of the second gate electrode 224 is exposed. Finally, a first drain electrode 212 corresponding to the first source electrode 211 and a second drain electrode 222 corresponding to the second source 221 are formed on the intermediate layer 213 and 223 so that and the first drain electrode 212 is connected to the second gate electrode 224 through the contact hole 250a. Accordingly, the EL device is completed, referring to FIG. 19.

By the above-mentioned process, the EL device can be realized without using a separate thin film transistor, that is, only using the organic light emitting transistor, and thus the structure of the EL device and the manufacturing process thereof can be simplified. Accordingly, the manufacturing costs can be reduced and the yield can be improved.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A method of manufacturing an organic electroluminescent device, the method comprising:
    forming a first source electrode and a second source electrode over a substrate;
    forming a capacitor insulating layer over the substrate to cover at least the first source electrode and the second source electrode;
    forming first and second gate electrodes over the capacitor insulating layer each having a donut shape, wherein the location of the first and second gate electrodes correspond to the locations of the first source electrode and the second source electrode, respectively;
    forming a planarization film over the substrate to cover at least the first gate electrode and the second gate electrode;
    forming a mask of high molecular weight material over the planarization film;
    forming through-holes in the mask, the planarization film, and the capacitor insulating layer to expose upper surfaces of the first source electrode and the second source electrode and side surfaces of the planarization film, the first gate electrode, the second gate electrode, and the capacitor insulating layer;
    forming gate insulating films to cover the side surfaces of the planarization film, the first gate electrode, the second gate electrode, and the capacitor insulating layer exposed by the through-holes;
    forming an intermediate layer comprising at least an emission layer in each of the through-holes;
    removing the mask;
    forming a contact hole in the planarization film to expose a portion of the second gate electrode; and
    forming over the intermediate layers a first drain electrode in a location corresponding to the location of the first source electrode and a second drain electrode in a location corresponding to location of the second source electrode, wherein the first drain electrode is connected to the second gate electrode through the contact hole and wherein the first gate electrode, the first source electrode and the first drain electrode are formed such that either:
        A) the first gate electrode is nearer the substrate than the first source electrode and the first drain electrode is nearer the substrate than the first gate electrode, or
        B) the first gate electrode is farther from the substrate than the first source electrode and the first drain electrode is farther from the substrate than the first gate electrode; and
    wherein the second gate electrode, the second source electrode, and the second drain electrode are formed such that either:
        A) the second gate electrode is nearer the substrate than the second source electrode and the second drain electrode is nearer the substrate than the second gate electrode, or
        B) the second gate electrode is farther from the substrate than the second source electrode and the second drain electrode is farther from the substrate than the second gate electrode.

2. The method according to claim 1, wherein forming the intermediate layers comprises depositing a low molecular weight organic material.

3. The method according to claim 1, wherein the capacitor insulating layer comprises an organic material or an inorganic material.

4. The method according to claim 1, wherein forming the through-holes is performed using a laser ablation method.

5. The method according to claim 1, wherein forming the gate insulating films comprises oxidizing the side surfaces of the planarization film, the first gate electrode, the second gate electrode, and the capacitor insulating layer exposed by the through-holes.

6. The method according to claim 5, wherein oxidizing the surfaces comprises using at least one of an $O_2$ plasma treatment and an $H_2O_2$ treatment.

7. A method of manufacturing an organic electroluminescent device, the method comprising:
    forming a first source electrode and a second source electrode over a substrate;

forming a capacitor insulating layer over the substrate to cover at least the first source electrode and the second source electrode;

forming first and second gate electrodes over the capacitor insulating layer each having a donut shape, wherein the location of the first and second gate electrodes correspond to the locations of the first source electrode and the second source electrode, respectively;

forming a planarization film over the substrate to cover at least the first gate electrode and the second gate electrode;

forming through-holes in the planarization film and the capacitor insulating layer to expose upper surfaces of the first source electrode and the second source electrode and side surfaces of the planarization film the first gate electrode, the second gate electrode, and the capacitor insulating layer;

forming gate insulating films to cover the side surfaces of the planarization film, the first gate electrode, the second gate electrode, and the capacitor insulating layer exposed by the through-holes;

forming an intermediate layer comprising at least an emission layer in each of the through-holes;

forming a contact hole in the planarization film to expose a portion of the second gate electrode; and forming over the intermediate layers a first drain electrode in a location corresponding to the location of the first source electrode and a second drain electrode in a location corresponding to the location of the second source electrode, wherein the first drain electrode is connected to the second gate electrode through the contact hole and wherein the first gate electrode, the first source electrode and the first drain electrode are formed such that either:
  A) the first gate electrode is nearer the substrate than the first source electrode and the first drain electrode is nearer the substrate than the first gate electrode, or
  B) the first gate electrode is farther from the substrate than the first source electrode and the first drain electrode is farther from the substrate than the first gate electrode; and wherein the second gate electrode, the second source electrode, and the second drain electrode are formed such that either:
  A) the second gate electrode is nearer the substrate than the second source electrode and the second drain electrode is nearer the substrate than the second gate electrode, or
  B) the second gate electrode is farther from the substrate than the second source electrode and the second drain electrode is farther from the substrate than the second gate electrode.

8. The method according to claim 7, wherein forming the intermediate layers comprises forming a layer comprising a high or a low molecular weight organic material in the through-holes using an inkjet printing method.

9. The method according to claim 7, wherein the capacitor insulating layer comprises an organic material or an inorganic material.

10. The method according to claim 7, wherein forming the through-holes is performed using a laser ablation method.

11. The method according to claim 7, wherein forming the gate insulating films comprises oxidizing the side surfaces of the planarization film, the first gate electrode, the second gate electrode, and the capacitor insulating layer exposed by the through-holes.

12. The method according to claim 11, wherein oxidizing the surfaces is performed using an $O_2$ plasma treatment or an $H_2O_2$ treatment.

* * * * *